(12) United States Patent
Park et al.

(10) Patent No.: US 12,396,106 B2
(45) Date of Patent: Aug. 19, 2025

(54) MULTI-DISPLAY DEVICE

(71) Applicant: LG ELECTRONICS INC., Seoul (KR)

(72) Inventors: Yongnam Park, Seoul (KR); Kitae Kang, Seoul (KR); Jinha Heo, Seoul (KR); Brian Chung, Seoul (KR); Jeongmo Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 140 days.

(21) Appl. No.: 18/115,389

(22) Filed: Feb. 28, 2023

(65) Prior Publication Data

US 2023/0209749 A1    Jun. 29, 2023

Related U.S. Application Data

(63) Continuation of application No. PCT/KR2021/010816, filed on Aug. 13, 2021.

(30) Foreign Application Priority Data

Aug. 31, 2020 (KR) .................. 10-2020-0110336

(51) Int. Cl.
| | |
|---|---|
| *H05K 5/00* | (2025.01) |
| *G09F 9/302* | (2006.01) |
| *H05K 5/02* | (2006.01) |
| *H05K 5/30* | (2025.01) |
| *H05K 5/03* | (2006.01) |

(52) U.S. Cl.
CPC ......... *H05K 5/0217* (2013.01); *G09F 9/3026* (2013.01); *H05K 5/30* (2025.01); *H05K 5/03* (2013.01)

(58) Field of Classification Search
CPC ...... H05K 5/0217; H05K 5/0021; H05K 5/03; G09F 9/3026; G09F 9/302; G09F 27/00
See application file for complete search history.

(56) References Cited

U.S. PATENT DOCUMENTS

| | | | |
|---|---|---|---|
| 8,982,546 B2 * | 3/2015 | Lin ........................ | G06F 1/1601 361/679.56 |
| 9,854,701 B2 * | 12/2017 | Choi ..................... | F16M 11/043 |
| 11,930,603 B2 * | 3/2024 | Miller .................. | H05K 5/0017 |
| 11,961,426 B2 * | 4/2024 | Zou ........................ | G09F 9/3026 |
| 12,078,285 B2 * | 9/2024 | Choi ..................... | F16M 11/046 |
| 2014/0153177 A1 * | 6/2014 | Lin ........................ | G06F 1/1643 361/679.21 |
| 2020/0068726 A1 * | 2/2020 | Hwang ................ | H05K 5/0221 |
| 2021/0010631 A1 * | 1/2021 | Wang ................... | F16M 11/046 |

FOREIGN PATENT DOCUMENTS

| | | |
|---|---|---|
| KR | 10-2014-0067771 A | 6/2014 |
| KR | 10-2015-0006434 A | 1/2015 |
| KR | 10-2019-0092968 A | 8/2019 |
| KR | 10-2020-0075549 A | 6/2020 |
| KR | 10-2020-0076384 A | 6/2020 |

* cited by examiner

*Primary Examiner* — Rockshana D Chowdhury
(74) *Attorney, Agent, or Firm* — Birch, Stewart, Kolasch & Birch, LLP (57) ABSTRACT

A multi-display device according to an embodiment of the present disclosure includes: a frame; a plurality of display modules fixed to the front of the frame; and an adjuster provided between each of the plurality of display modules and the frame, and installed such that the height of the display modules is adjustable at the rear of the frame.

17 Claims, 9 Drawing Sheets

[Graph 1]

Fig. 14

[Graph 2]

MULTI-DISPLAY DEVICE

CROSS REFERENCE TO RELATED APPLICATIONS

This application is a Continuation of PCT International Application No. PCT/KR2021/010816, filed on Aug. 13, 2021, which claims priority under 35 U.S.C. 119(a) to Patent Application No. 10-2020-0110336, filed in the Republic of Korea on Aug. 31, 2020, all of which are hereby expressly incorporated by reference into the present application.

TECHNICAL FIELD

The present disclosure relates to a technology of adjusting a height difference between displays in a multi-display device having a plurality of displays.

BACKGROUND ART

A digital signage as a communication tool that can derive marketing, advertising, training effects, and customer experience of companies is a display device that provides specific information in addition to a broadcasting program in public places such as airports, hotels, hospitals, subway stations, etc.

One example of a device which can be used as the digital signage is a multi-display device constituted by a plurality of displays.

The multi-display device is constituted by the plurality of displays, so it is not easy to flatten a screen. For example, in the multi-display device, eight 40-inch screens are combined to form one large screen. However, since the plurality of displays installed in the frame displays a single screen, there is a problem in that a distortion phenomenon of the screen occurs when a step between the displays that are neighboring in upper and lower directions or left and right directions occur.

In the multi-display device that has been proposed so far, a method of adjusting the height difference (or step) is a method of using an adjustment pin. In the method of using a control fin, the step between the screens is adjusted in a form in which the adjustment pin is placed between the display and the frame, and the height of the adjustment pin is adjusted to adjust the height of the screen.

This adjustment pin method is a method of checking whether the step between the displays is adjusted after adjusting the height of the adjustment pin after removing the display from the frame, and installing the removed display in the frame in order to adjust the step. Therefore, there is inconvenience that a process of removing the display from the frame every time, installing the removed display in the frame again after adjusting the adjustment pin, and then, checking whether the step is adjusted, and removing the display again, adjusting the height of the adjustment pin, and returning the display to an original location if the step adjustment is required should be repeated in order for an operator to adjust the step.

DISCLOSURE

Technical Problem

The present disclosure has been made in an effort to adjust a height of a display without removal of a display in order to solve such a problem.

Technical Solution

A multi-display device according to an embodiment of the present disclosure includes: a frame; a plurality of display modules fixed to the front of the frame; and an adjuster provided between each of the plurality of display modules and the frame, and installed such that the height of the display modules is adjustable at the rear of the frame.

The adjuster includes a fastening member formed to protrude toward the frame on the rear surface of the display module, and having a screw line therein, and an elastic member fitted into the fastening member, and the display unit and the frame are fixed by a bolt fastened to the fastening member on the rear surface of the frame.

The height of the elastic member may be larger than the height of the fastening member.

The frame may further include a supporter supporting a rear circumference of each of the plurality of display modules on the front surface.

The adjuster may be arranged immediately neighboring to the supporter.

The adjuster includes a first adjuster arranged at a corner of the display module and a second adjuster arranged between the first adjusters.

The pillar portion may further include a recess to which the elastic member is assembled to an outer peripheral surface.

Advantageous Effects

In a multi-display device according to an embodiment of the present disclosure, an adjuster can be provided between a display and a frame, and the adjuster can adjust a display height at the rear of the frame. Therefore, an operator can adjust the height of the display in a state in which the display is not removed, but installed in the frame.

DESCRIPTION OF THE EMBODIMENTS

In the following description, an embodiment of the present disclosure will be described in detail with reference to the accompanying drawings to be implemented by those skilled in the art.

However, the present disclosure may be modified in various different ways, all without departing from the spirit or scope of the present disclosure. In addition, a part which is not related with the description may be simplified or omitted in the drawings in order to clearly describe the present disclosure. Further, various embodiments illustrated in the drawings are exemplarily presented, and components are simplified and illustrated differently from actual components for convenience of description.

In the following detailed description, the same components which have no difference according to the embodiments are denoted by the same reference numerals, and a description thereof is not repeated.

Figure 1:
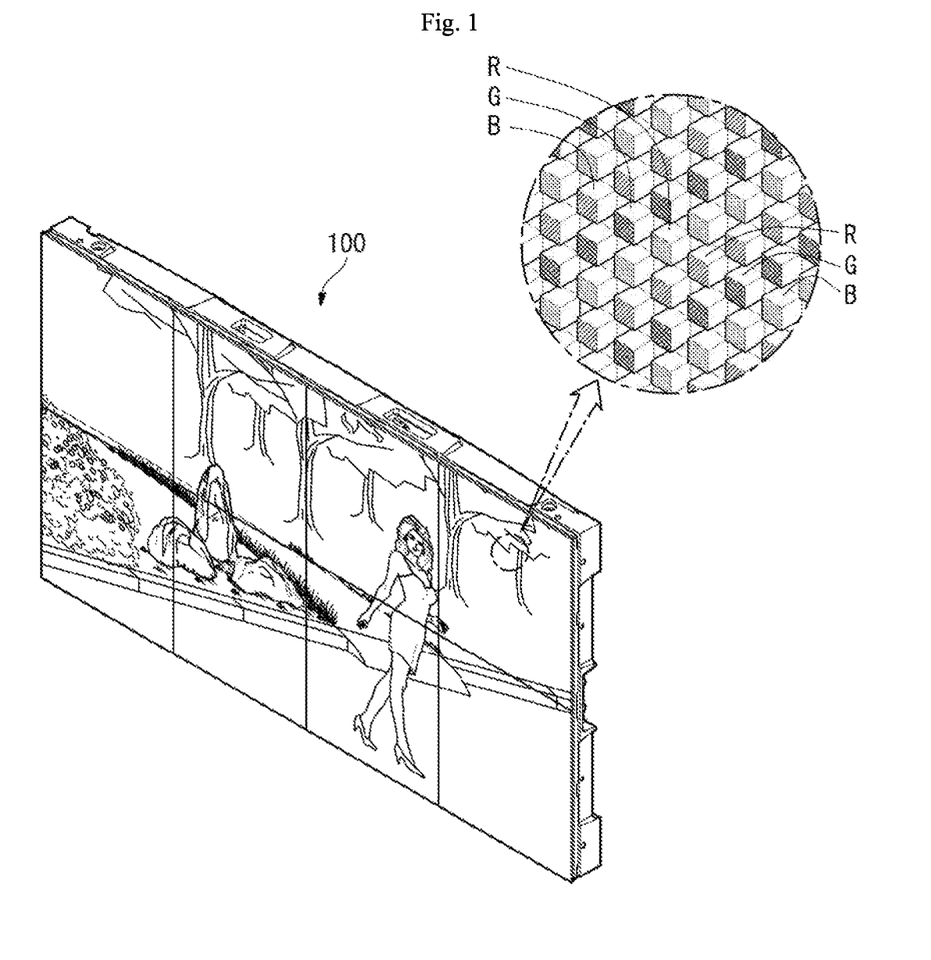
FIG. 1 is a diagram illustrating an entire view of a multi-display device according to an embodiment.
Figure 2:
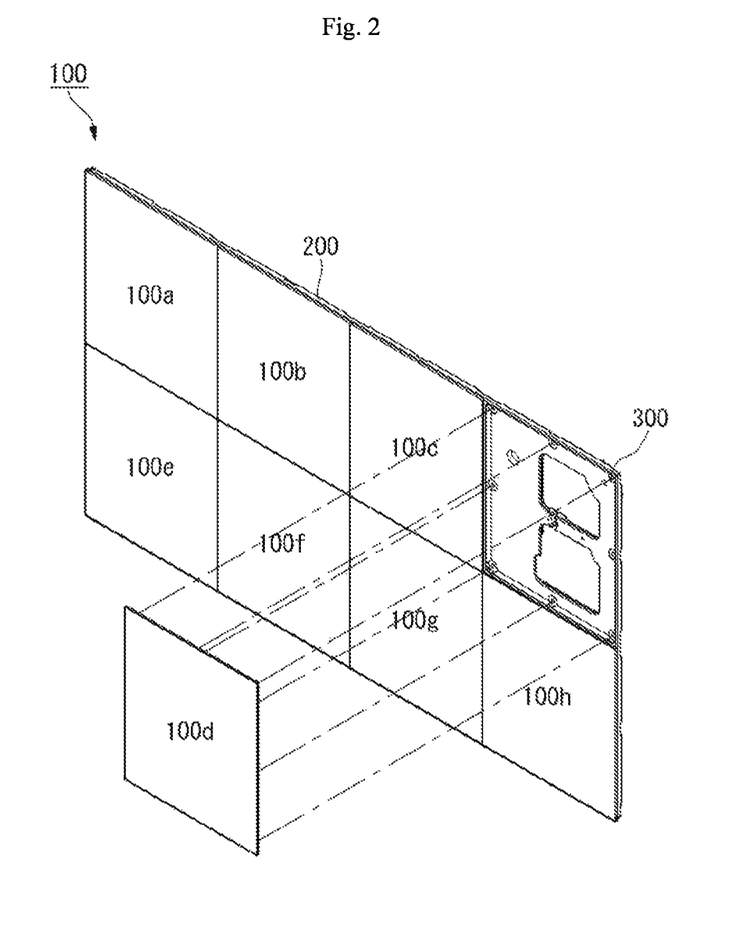
FIG. 2 is a diagram illustrating disassembly of one display unit from the multi-display device illustrated in FIG. 1.

FIG. 1 is a diagram illustrating an entire view of a multi-display device according to an embodiment and FIG. 2 is a diagram illustrating disassembly of one display unit from the multi-display device illustrated in FIG. 1.

Referring to FIGS. 1 and 2, a multi-display device 1000 may be configured to include a plurality of display modules 100a to 100h, a frame 200, and an adjuster 300.

The display modules 100a to 100h are operated so that a plurality of displays physically divided are gathered and driven as one display to display a screen. As such, when the plurality of displays is used, there is an advantage in that a large screen may be easily created. As widely well known, the display, in particular, a flat-panel display such as a liquid crystal display (LCD) or an organic light emitting diode (OLED) is difficult to create a large screen of 100 inches or more, and even though the large screen is created, there is a disadvantage in that the large screen is expensive. As an alternative, when multiple displays having a size, which are universally manufactured are gathered and configured as one screen, it is advantageous in terms of cost.

The display modules 100a to 100h constituted by the plurality of displays are arrayed in the form of the m*n matrix to configure one large screen. Hereinafter, except for a special case, the display modules 100a to 100h constituted by the plurality of displays are called a multi-display unit.

Each display module constituting the multi-display unit 100 may include a display panel (not illustrated) and a module cover (not illustrated) positioned at the rear of the display panel and supporting the display panel.

The display panel may include a plurality of pixels R, G, and B. The plurality of pixels R, G, and B may be formed in each of areas where multiple data lines and multiple gate lines intersect. The plurality of pixels R, G, and B may be arranged or arrayed in the form of a matrix.

For example, the plurality of pixels R, G, and B may include a red (hereinafter, referred to as 'R') subpixel, a green ('U'), and a blue ('B') subpixel. The plurality of pixels R, G, and B may further include a white (hereinafter, referred to as 'W') subpixel.

In the display panel, a side may be referred to as a front side or a front surface. When the display panel displays an image, a side at which the image may not be observed may be referred to as a rear side or a rear surface. When the display panel is viewed from the front side or the front surface, an upper side may be referred to as an upper side or an upper surface. Similarly, a lower side may be referred to as a lower side or a lower surface. Similarly, a right side may be referred to as a right side or a right surface and a left side may be referred to as a left side or a left surface.

The display panel may be, for example, at least one of a liquid crystal display (LCD), an organic light emitting diode (OLED), and a micro LED.

The module cover is arranged at the rear side of the display panel to protect the rear surface of the display panel 101 from the outside and mechanically support the display panel.

The multi-display unit 100 may include a first display module 100a to an eighth display module 100h. The first display module 100a to the sixth display module 100h may be arrayed neighboring to each other in upper and lower directions or left and right directions.

For example, the first display module 100a to the fourth display module 100d may be arranged in order at the upper side of the frame 200, and the fifth display module 100e to the eight display module 100h may be arranged in order at the lower side. As a result, the first to eight display modules may be arranged to have a 2×4 matrix array.

The first to eight display modules are arrayed as such and fixed to the frame, and eight displays are gathered to display one screen, and sometimes, each display may also display a separate screen, or at least two displays among eight displays are gathered to be driven to display the screen.

The frame 200 may be arranged at the rear side of the multi-display unit 100. The front surface of the frame 200 may face the rear surface of the multi-display unit 100. The frame 200 is positioned on the rear surface of the multi-display unit 100, and supports and fixes the multi-display unit 100. The frame 200 may be formed in a picture frame in which a central area is opened or may also be formed as a flat panel without the opened area.

The frame 200 may elongate in the upper and lower directions and the left and right directions. For example, an upper or lower length of the frame 200 may be substantially equal to a length acquired by adding the first display module 100a to the fourth display module 100d or a length acquired by adding the fifth display module 100e to the eight display module 100h. In addition, a left or right length of the frame 200 may be substantially equal to a length acquired by adding left sides of the first display module 100a and the fifth display module 100e or a length acquired by adding right sides of the fourth display module 100d and the eight display module 100h. The frame 200 may also be formed to be longer or shorter than the display module 100 according to an external environment such as a building or a wall in which the frame 200 is installed.

The frame 200 may have a thickness larger than thicknesses of the plurality of display modules 100.

In FIGS. 1 and 2, it is illustrated that one frame 200 is formed, but the present disclosure is not limited thereto. The frame 200 may be split into a plurality of frames, and assembled.

The adjuster 300 may be arranged between the multi-display unit 100 and the frame 200. In one example, the adjuster 300 may be mounted on the front surface of the frame 200 or the rear surface of the multi-display unit 100 in a thickness direction of the multi-display unit 100. The adjuster 300 adjusts the height of the display module by adjusting a distance between the rear surface of the multi-display unit 100 and the front surface of the frame 200. The height of the adjuster may be adjusted on the rear surface of the frame 200, so the height of the display module may be adjusted without a need for removing the display module from the frame differently from the related art. Further, in an embodiment, the adjuster 300 just adjusts the height of the display module and fixes the display module to the frame.

Figure 3:
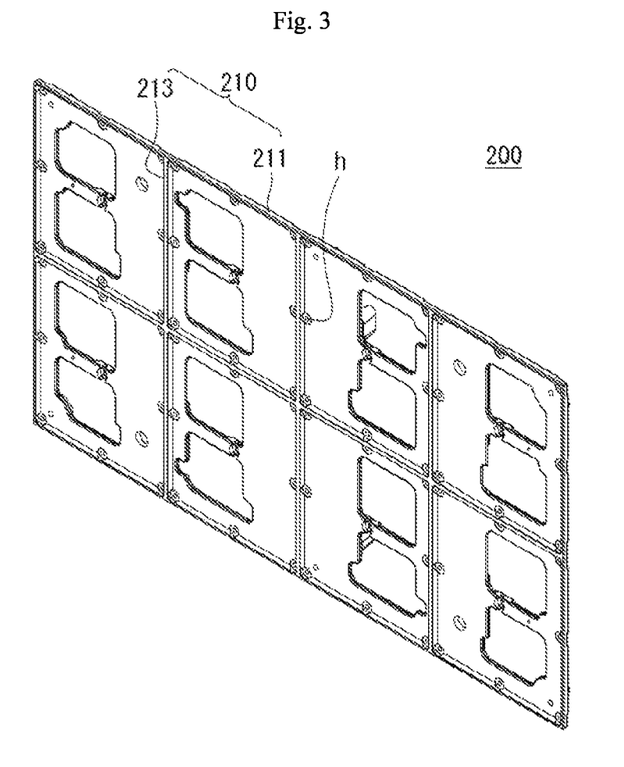
FIG. 3 is a diagram illustrating an entire view of a frame.

Hereinafter, the frame 200 will be described in more detail with reference to FIG. 3. FIG. 3 is a diagram illustrating an entire view of a frame.

Referring to FIG. 3, the frame 200 may be configured to include a supporter 210 supporting each of the display modules 100a to 100h. The supporter 210 may also be formed by protruding toward the rear surfaces of the display modules 100a to 100h by a part of the front surface of the frame or by additionally installing a member in the frame 200.

The frame 200 has an approximately rectangular shape according to the multi-display unit 100, and has a size to support the plurality of display modules 100a to 100h. The frame 200 may have an approximately rectangular parallelepiped shape. The front surface of the frame 200 is flat as a whole.

The frame 200 may be configured to include the supporter 210 individually supporting the plurality of display modules 100a to 100h on the front surface. The supporter 210 supports a circumference of each of the display modules 100a to 100h to allow the display modules 100a to 100h to be positioned spaced apart from the bottom by a predetermined distance. Here, the circumference of the display module refers to an outer periphery of the display module.

If the supporter 210 is a form to support the circumference of each of the display modules 100a to 100h, a shape is not particularly limited. Since the display module 100 has the rectangular shape, the supporter 210 may also have the rectangular shape according to the rectangular shape of the display module 100.

In an embodiment, the plurality of display modules 100a to 100h is installed in the frame 200 to configure one screen. In the drawing, the supporter 210 may include a first supporter 211 arranged to have a square shape along the circumference of the frame 200 and a second supporter 213 splitting an interior of the first supporter 21 into n according to the number of display modules.

As a result, the first and second supporters 211 and 213 may split the front surface of the frame 200 according to the number of display modules, and each of the display modules 100a to 100h may be supported by the supporter 210.

Holes h are formed neighboring to the supporters 211 and 213. The holes h are formed at every locations facing the adjuster 300 formed on the rear surface of the display module to be described below.

Hereinafter, the adjuster 300 arranged between the plurality of display modules 100a to 100h and the frame 200 and adjusting the heights of the plurality of display modules 100a to 100h at the rear of the frame will be described in detail.

In an embodiment, a plurality of adjusters 300 may be arranged for each of the display modules 100a to 100h.

Figure 4:
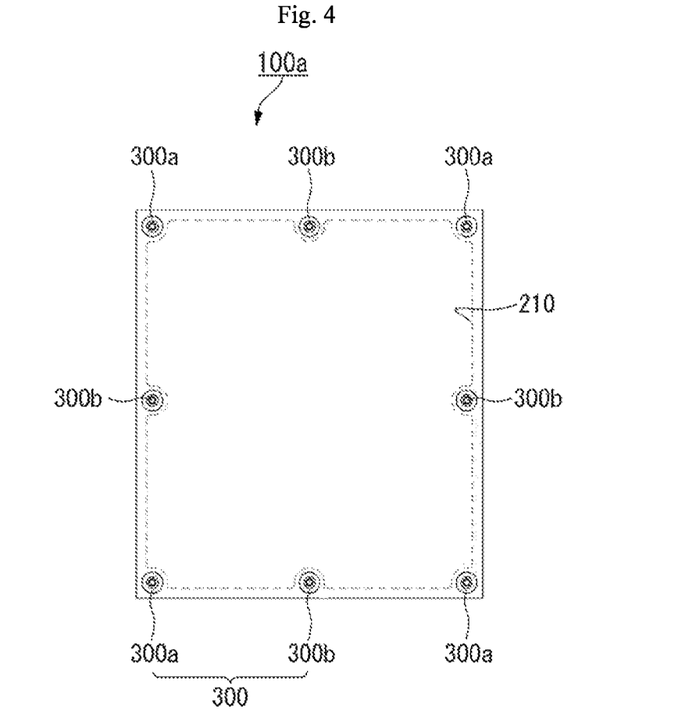
FIG. 4 is a diagram illustrating a rear view of a display module.

FIG. 4 representatively illustrates a rear view of the first display module 100a in the multi-display unit. In an embodiment, each of the plurality of display modules 100a to 100h has the rear view as illustrated in FIG. 4.

The display module 100 has the approximately rectangular shape, and a portion where each side is gathered forms a corner.

In an embodiment, the adjuster 300 includes a first adjuster 300a arranged at the corner and a second adjuster 300b arranged between the first adjusters. Therefore, in the drawing, an example in which a total of eight adjusters are formed on the rear surface of the display module 100a is illustrated, and a total of three adjusters may be arranged along each side. Meanwhile, in the drawing, when the display module and the frame 200 are coupled to each other, dotted lines indicate the location of the supporter 210.

In an embodiment, since the adjuster 300b is arranged even between the corners in addition to the corner, it is easy to adjust the height of the display module 100.

Further, the adjuster 300 adjusts the height of the display module, and couples the display module to the frame 200 to increase a mechanical fastening force.

In a preferable form, the adjusters 300a and 300b may be arranged neighboring to the supporter 210. When the adjusters 300 is arranged neighboring to the supporter 210, there is an advantage in that a mechanical coupling force of the display module may be increased.

Hereinafter, the adjuster 300 will be described in more detail with reference to FIGS. 5 to 8.

Figure 5:
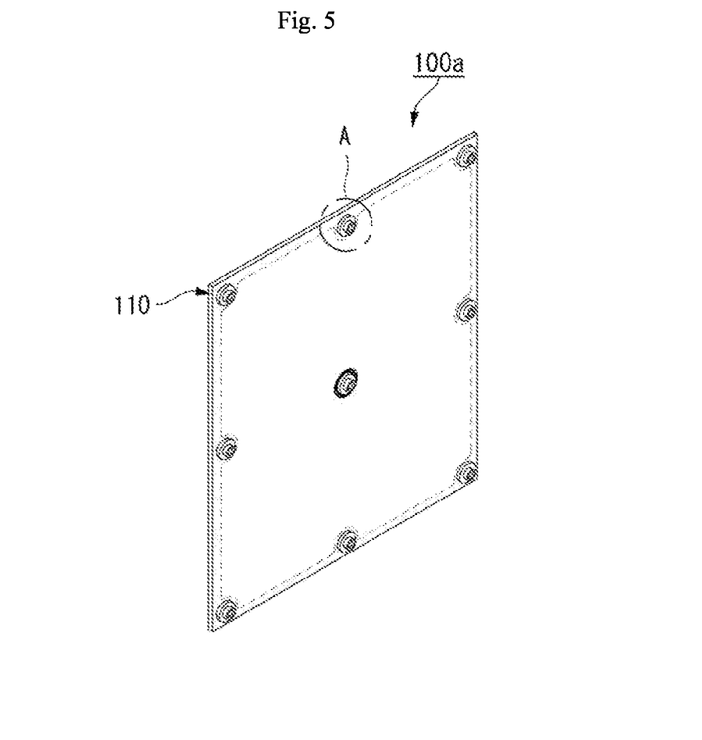
FIG. 5 is a diagram illustrating a rear of the display module.
Figure 6:
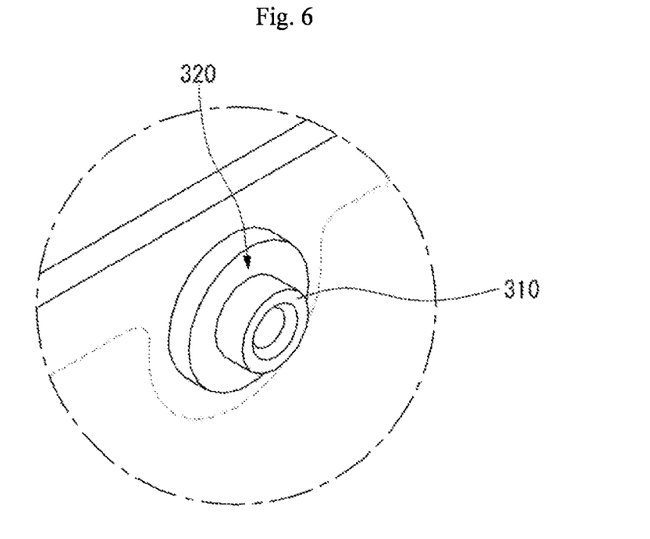
FIG. 6 is a diagram illustrating enlarged part "A" in FIG. 5.
Figure 7:
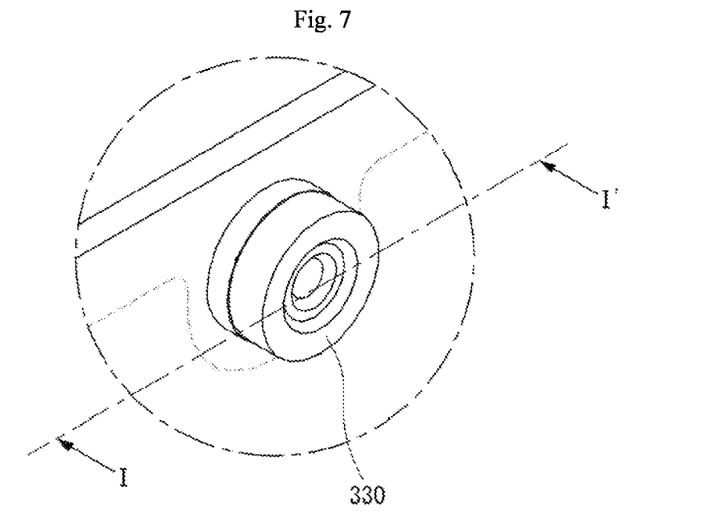
FIG. 7 is a diagram illustrating a view in which an elastic member is coupled to a pillar portion.
Figure 8:
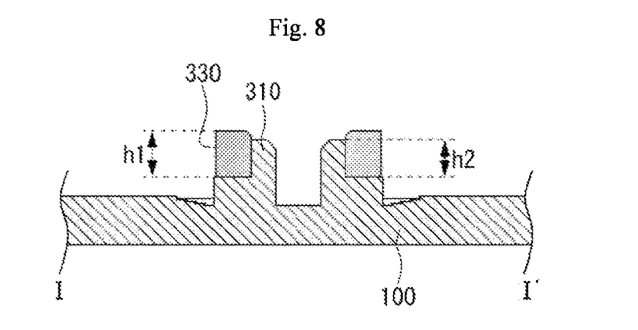
FIG. 8 illustrates a cross-sectional view of an adjuster illustrated in FIG. 7.

FIG. 5 is a diagram illustrating a rear of the display module and FIG. 6 is a diagram illustrating enlarged part "A" in FIG. 5. In addition, FIG. 7 is a diagram illustrating a view in which an elastic member is coupled to a pillar portion and FIG. 8 illustrates a cross-sectional view of an adjuster illustrated in FIG. 7.

The adjuster 300 may be configured to include a pillar portion 310 which protrudes on the rear surface of the display module 100, has a hollow therein, and has a screw line.

The pillar portion 310 has a cylindrical shape, and an outer peripheral surface of a cylinder is configured to include a stepped recess 320.

In one example, the adjuster 300 may be configured to further include an elastic member 330. The elastic member 330 may be, for example, rubber, and various components having an elastic restoration force may be used as the elastic member 330 without a particular limit.

The elastic member 330 may have a ring shape to be seated on the recess 320. The elastic member 330 is fitted into the pillar portion 310a and accepted in the recess 310b. When the elastic member 330 is coupled to the pillar portion 310, a first height h1 of the elastic member 330 is larger than a second height h2 of the pillar portion 310. Therefore, when the elastic member 320 is coupled to the pillar portion 310a, the elastic member 320 may be arranged to protrude outside the pillar portion 310.

Figure 9:
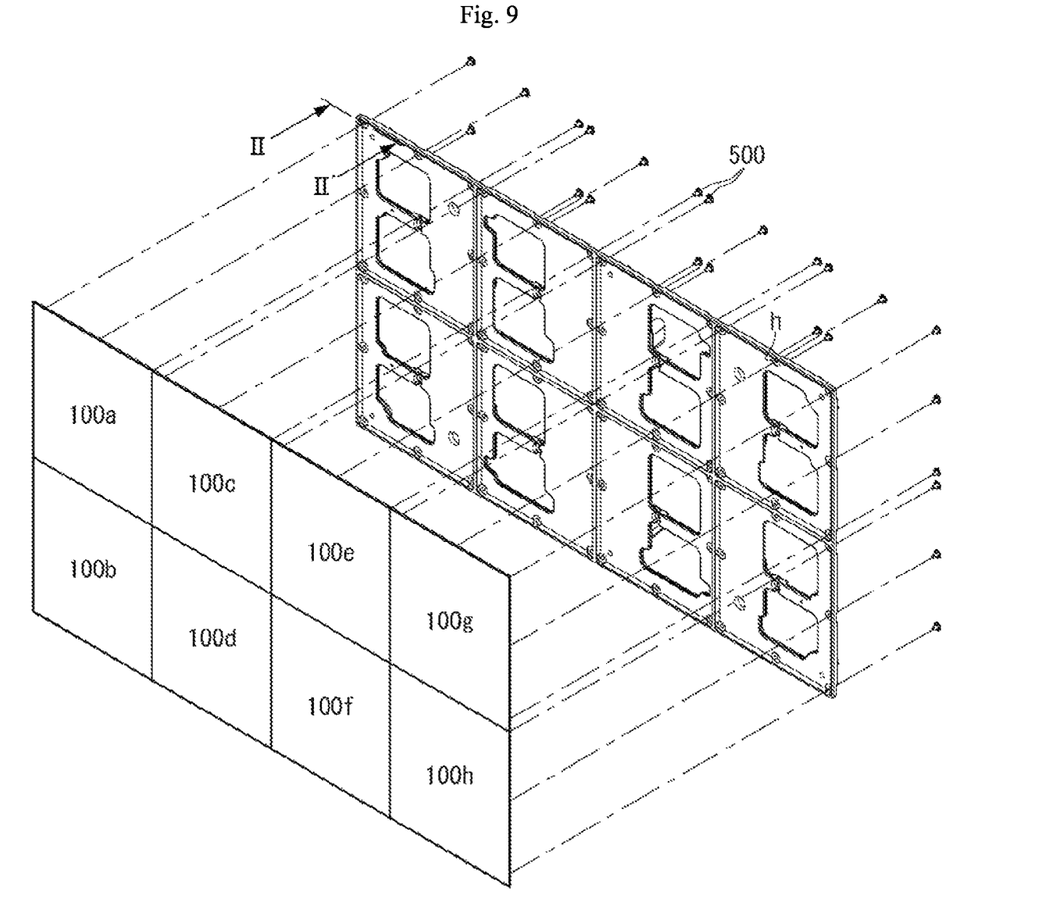
FIG. 9 is a diagram illustrating a disassembled frame of a multi-display unit.
Figure 10:
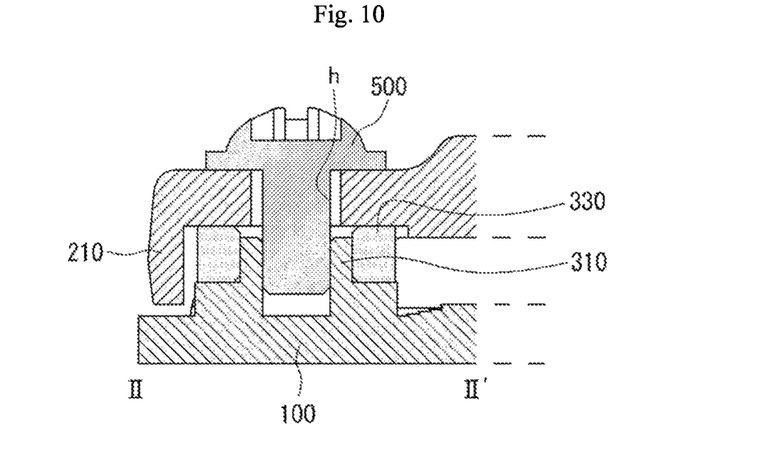
FIG. 10 is a cross-sectional view taken along line II-II' of FIG. 9.

Hereinafter, how the display unit 100 is assembled to the frame will be described with reference to FIGS. 9 and 10. FIG. 9 illustrates a disassembled frame of a multi-display unit 100 and FIG. 10 is a cross-sectional view taken along line II-II' of FIG. 9.

Referring to the drawing, a plurality of solar cell modules 100a to 100h constituting the multi-display unit 100 are positioned with the frame 200 so that a rear circumference of the solar cell module may be supported by the supporter 210.

In this case, the adjuster 300 provided on the rear surface of the solar cell module is positioned to face the hole h provided in the frame 200 and in this state, a bolt 500 is fastened to the adjuster 300, and as a result, the display module may be assembled to the frame 200.

In this case, the elastic member 330 constituting the adjuster 300 is positioned between the frame 200 and the display module 100. However, since the elastic member 330 protrudes out of the pillar portion 310 as described through FIG. 8, the elastic member 330 plays a role like a spring when bolt-fastening the display module 100 to the frame 200 to adjust the height of the display module 100.

Figure 11:
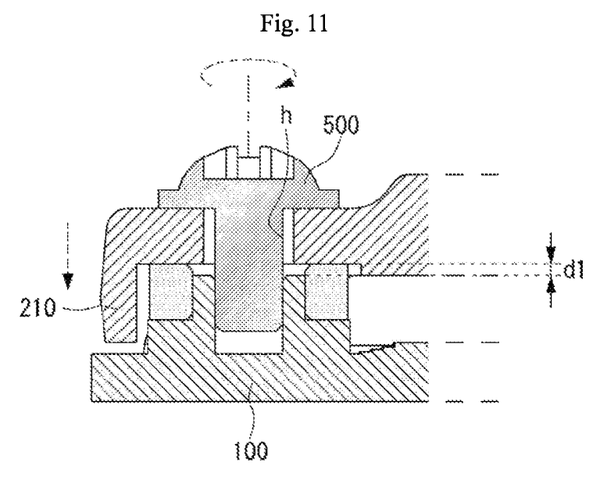
FIGS. 11 and 12 are diagrams for describing a process of adjusting a height of the display module.
Figure 12:
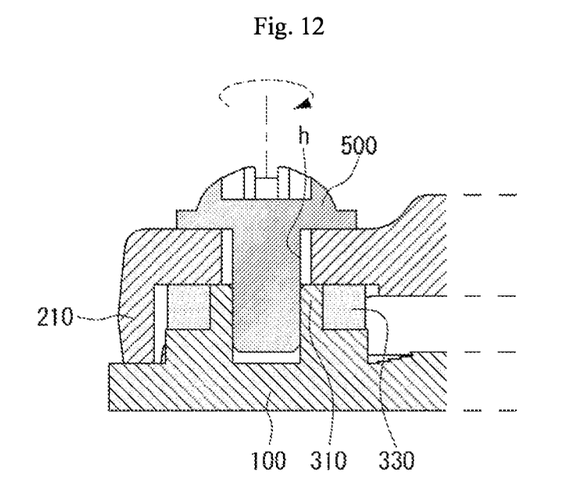

In this regard, FIGS. 11 and 12 will be described as follows as an example.

In a default, the pillar portion 310 and the elastic member 330 have a clearance which is large as d1. Therefore, when the display module is initially bolt-fastened to the frame 200, the display module may be assembled with the clearance which is as large as d1 by a height difference between the elastic member 330 and the pillar portion 310a, and if the bolt 500 is maximally rotated, the display module may be assembled while being completely closely contacted with the frame 200 in a state illustrated in FIG. 12.

Due to such a reason, the display module may be assembled to the frame 200 while adjusting the height within a range of d1.

Preferably, d1 may have a range of 0 to 0.5 mm by considering a deforming force of the elastic member 330.

Hereinafter, in a case including the adjuster, an effect thereof will be described.

In order to describe the effect of the present disclosure, the case is modeled by the following method, and a result thereof is disclosed in Table 1 below.

In the table, Ra represents an arithmetic average roughness, and Max-Min represents a difference between a maximum value and a minimum value. Therefore, as Ra or Max-Min is smaller, there is the effect. Further, Cap 5000R indicates a state in which the model is initially bent. The Cap 5000R model is initially in a state of being bent to have a curvature 5000R in a cap shape. On the contrary, a cup 5000R is initially in a state of being bent to have a curvature 10000R in a cup shape.

A simulation uses cap 5000R, cap 10000R, cup 5000R, and cup 10000R models.

In Table 1 below, an initial case is a measured value in a state in which models not fixed to a holder, and case 1 to case 3 show measured values after models are flatly fixed to the holder by using the adjuster. In addition, case 1 refers to a form in which the adjuster is arranged at each corner of the rectangular display panel, case 2 refers to a form in which the adjuster is arranged at four respective corners and between the corners, i.e., eight portions, and case 3 refers to a form in which the adjuster is arranged at four respective corners and at two portions between the corners, i.e., a total of 12 portions.

According to such a simulation result, surface roughness Ra or a Max-Min value is significantly changed between an initial case and case 1, and between case 1 and case 2, but there is no change between case 2 and case 3. That is, it can be known that when the adjustment unit is arranged as in case 2, the effect is very large. In the following table, a unit is (um).

TABLE 1

| | | Initial case | Case 1 | Case 2 | Case 3 |
|---|---|---|---|---|---|
| Cap 5000R | Ra | 195 | 24 | 0.4 | 0.2 |
| | Max-Min | 712 | 68 | 2 | 1 |
| Cap 10000R | Ra | 102 | 12 | 0.2 | 0.1 |
| | Max-Min | 356 | 34 | 1 | 0.5 |
| Cup 5000R | Ra | 170 | 20 | 3 | 3 |
| | Max-Min | 711 | 101 | 11 | 11 |
| Cup 10000R | Ra | 95 | 10 | 2 | 1 |
| | Max-Min | 356 | 53 | 5 | 5 |

Figure 13:
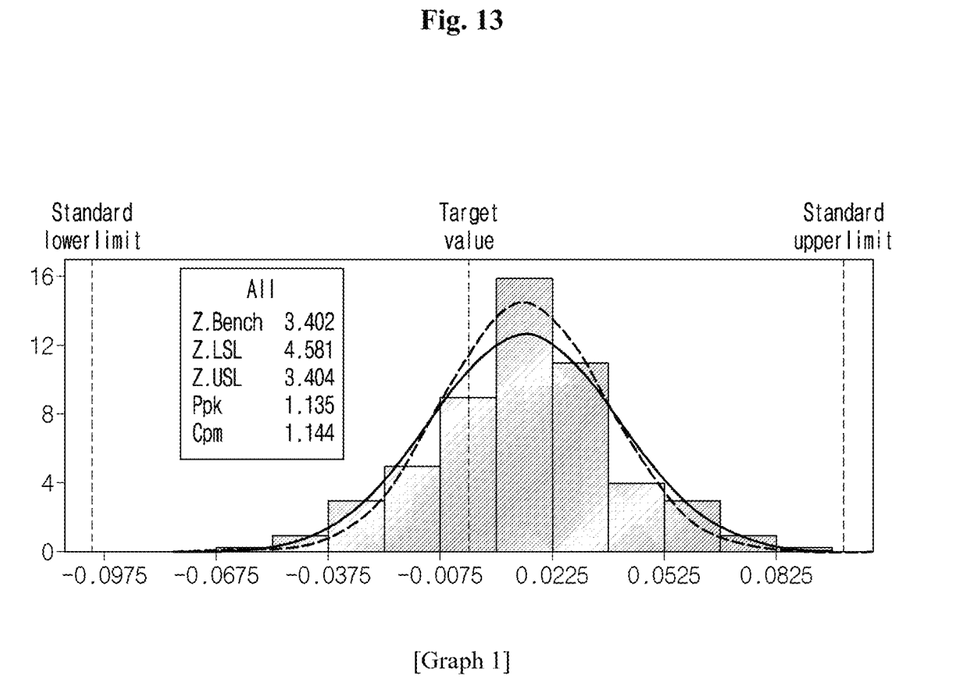
FIGS. 13 and 14 show Graphs 1 and 2, respectively, which are graphs showing a result of experimenting distributions before and after adjusting the step of the display.
Figure 14:
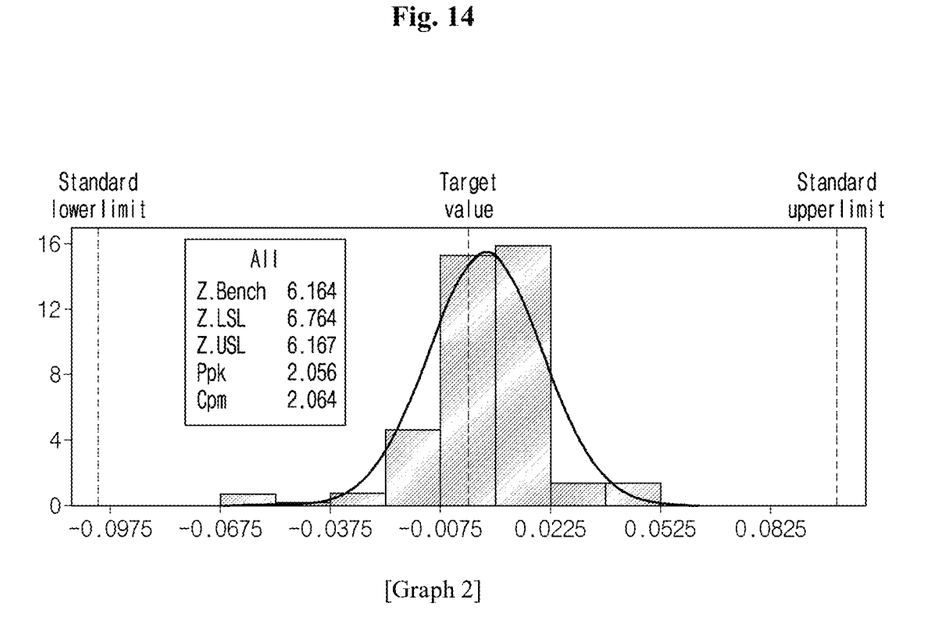

Graphs 1 and 2, as shown in FIGS. 13 and 14, are graphs showing a result of experimenting distributions before and after adjusting the step of the display. In the graph, an x axis represents the step and a y axis represents the distribution. This experiment is achieved by a method of measuring the step for 30 points by a contact method in one multi-display unit 100. Here, the step refers to a mutual height step between the displays. Graph 1 shows the distribution of the steps by measuring the steps in a state in which the display module is assembled to the frame by fastening the bolt to the adjuster by a predetermined force by default before adjusting the step, and Graph 2 shows a distribution after adjusting the step.

[Graph 2]

Graph 2, as shown in FIG. 14, shows a step-specific distribution with respect to steps of +0.1 mm to −0.1 mm.

As can be known through the graph, a step average 0.023 (mm) and a maximum step is 0.078 (mm) before adjusting the step, while the step average 0.012 (mm) and a maximum step 0.048 (mm) after adjusting the step. Further, before a step distribution chart, a Gaussian distribution is shown between −0.0675 (mm) and +0.0825 (mm) based on 0. After adjusting the step, the Gaussian distribution is shown between −0.0375 (mm) and +0.0525 (mm). That is, it can be known that the step is remarkably reduced after adjusting the step.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

The invention claimed is:

1. A multi-display device comprising:
a frame;
a plurality of display modules fixed to a front surface of the frame; and
an adjuster provided between each of the plurality of display modules and the frame, and installed so that a height of the display modules is adjustable at a rear of the frame,
wherein the adjuster includes:
a pillar portion formed to protrude toward the frame on a rear surface of a display module of the plurality of display modules, the pillar portion having a screw line therein, and having a recess formed on an outer peripheral surface of the pillar portion, and the recess being formed on a surface of the pillar portion facing the frame, and
a rubber-made elastic member fitted into the recess of the pillar portion, and protruding out of the pillar portion,
wherein the display module is fixed to the frame while the height is adjusted by a bolt fastened to the pillar portion on a rear surface of the frame,
wherein the elastic member is in direct contact with the recess and the frame, and
wherein the surface of the pillar portion facing the frame is apart from the frame.

2. The multi-display device of claim 1, wherein a height of the elastic member is larger than a height of the pillar portion, and
wherein the elastic member protrudes outside of the pillar portion.

3. The multi-display device of claim 1, wherein the frame further includes a supporter supporting a rear circumference of each of the plurality of display modules on the front surface of the frame.

4. The multi-display device of claim 3, wherein the adjuster is arranged immediately neighboring to the supporter.

5. The multi-display device of claim 4, wherein the adjuster includes at least two first adjusters arranged respectively at corners of the display module and a second adjuster arranged between the at least two first adjusters.

6. The multi-display device of claim 1, wherein a height adjustment range of the display module is 0 to 0.5 millimeters (mm).

7. The multi-display device of claim 1, wherein the elastic member has a ring shape in which a bottom and a top are flat.

8. The multi-display device of claim 7, wherein an inner diameter of the ring shape is smaller than an outer diameter of the pillar portion.

9. The multi-display device of claim 6, wherein the elastic member is more deformed in a width direction of the elastic member than in a height direction of the elastic member.

10. The multi-display device of claim 6, wherein when the display module is completely closely contacted with the frame, an adjustment height is 0.5 mm, and when the display module is coupled to the frame without form deformation of the elastic member, the adjustment height is 0 mm.

11. The multi-display device of claim 10, wherein when the adjustment height is 0.5 mm, a top of the elastic member and a top of the pillar portion are positioned substantially at a same location.

12. The multi-display device of claim 10, wherein when the adjustment height is 0 mm, a top of the elastic member protrudes over a top of the pillar portion.

13. The multi-display device of claim 1, wherein the display module includes:
a display panel, and
a module cover supporting the display panel, and
wherein the display panel includes a micro light emitting diode (LED).

14. The multi-display device of claim 1, wherein a maximum length of the pillar portion is smaller than a maximum length of the recess.

15. The multi-display device of claim 14, wherein a maximum length of the elastic member is a same length as the maximum length of the recess.

16. The multi-display device of claim 1, wherein the pillar portion protrudes through a portion of the elastic member.

17. The multi-display device of claim 1, wherein a portion of the display module directly adjacent to a bottom of the recess is curved away from the recess.

* * * * *